United States Patent [19]

Lemmer

[11] 4,274,196

[45] Jun. 23, 1981

[54] ASSEMBLY TABLE FOR CONDUCTOR BOARDS

[76] Inventor: Alfred Lemmer, Machtlfingerstrasse 24, D-8000 Munchen 70, Fed. Rep. of Germany

[21] Appl. No.: 84,827

[22] Filed: Oct. 15, 1979

[30] Foreign Application Priority Data

Oct. 24, 1978 [DE] Fed. Rep. of Germany ....... 2846262

[51] Int. Cl.³ .............................................. H05K 3/30
[52] U.S. Cl. ........................................ 29/741; 29/823; 29/836
[58] Field of Search ...................... 29/741, 739, 569.1, 29/834, 835, 836, 759, 823

[56] References Cited

U.S. PATENT DOCUMENTS 4,030,180  6/1977  Pierson .................................. 29/741

Primary Examiner—Carl E. Hall
Attorney, Agent, or Firm—Fitzpatrick, Cella, Harper & Scinto

[57] ABSTRACT

An improved assembly table for assembling conductor boards wherein integrated circuits to be inserted on the boards are conveyed by trays automatically and in a synchronized manner from a rotatable magazine to the conductor boards. The integrated circuits are contained in predetermined arrangement in the magazine and are picked up one at a time by a transfer means and each integrated circuit is deposited in an associated tray with a recess shaped to accept the integrated circuit. This arrangement permits safe direct picking up of the integrated circuits with assembly tongs within short reach of the conductor boards.

28 Claims, 6 Drawing Figures

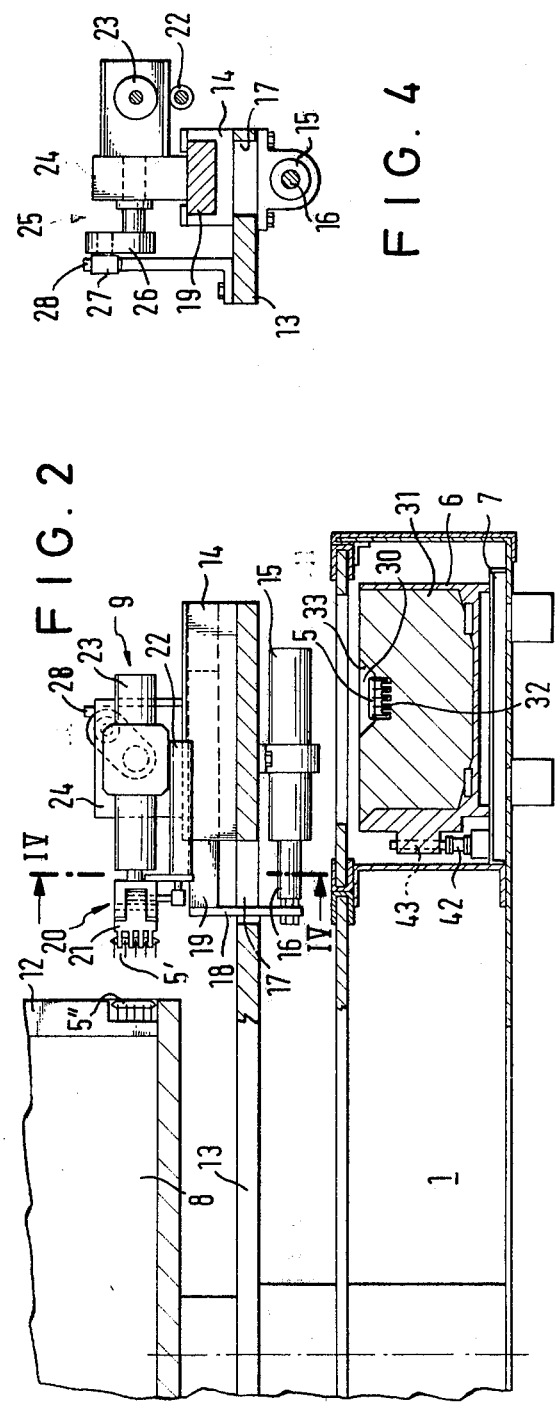
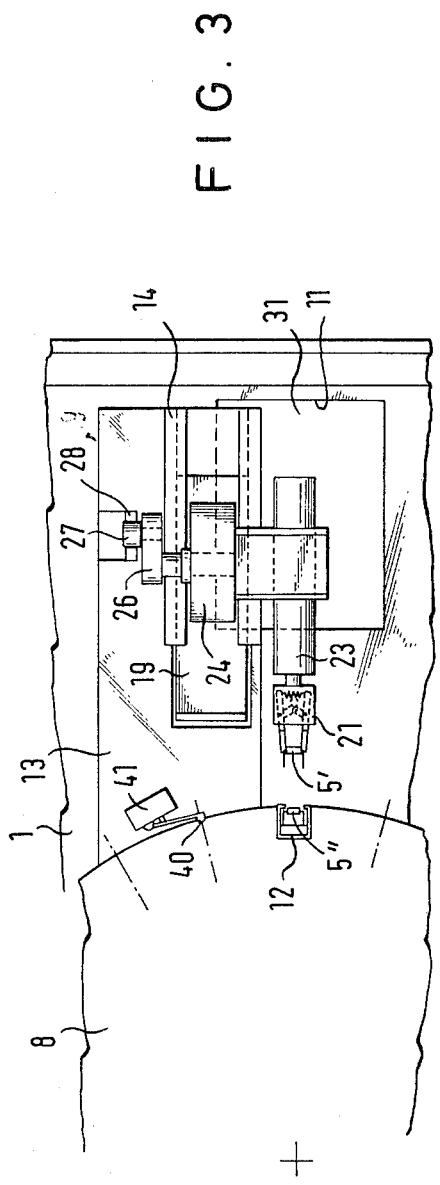

ASSEMBLY TABLE FOR CONDUCTOR BOARDS

BACKGROUND OF THE INVENTION

1. Field of the Invention

This invention relates to assembly tables for assembling conductor boards, and more particularly it concerns a novel arrangement whereby integrated circuits to be inserted on the boards are fed into trays in preassigned positions from a rotatable magazine and conveyed automatically to an assembly station where they may be picked up in preassigned positions with integrated circuit assembly tongs and inserted in preassigned locations in the conductor board to be assembled.

2. Description of the Prior Art

In equipping conductor boards with components, use is currently made of assembly tables at which conductor boards to be assembled may be mounted at an assembly station on the tables. An operator inserts the components in question in the conductor boards in their desired position. To simplify the insertion operation, components are placed in trays with similar components arranged in the same tray. The trays may be conveyed past the assembly station in definite sequence, so that the operator at any given time picks up the desired number of components contained in the tray directly adjacent to the station. When equipping the conductor board with integrated circuits, however, major problems have been encountered. Since integrated circuits possess a plurality of connection pins or tabs, often spaced apart only by a distance determined by the minimum grid interval, when certain of the trays were loaded with several integrated circuits, the integrated circuits were very apt to tangle. The operator was thus obliged first to separate the required integrated circuit manually from the others, a time-consuming operation. Moreover, the entire operation is time-consuming. Since the integrated circuits must be inserted in the conductor board with special integrated circuit assembly tongs, the selected integrated circuit must also be placed in the tongs manually and in preassigned position. A further disadvantage is that during the operation the integrated circuit may become damaged. In detaching one integrated circuit from the other integrated circuits in a tray and placing it in the assembly tongs, inevitably the operator, even with the utmost care, will touch the connection pins. Since the operator's person often will hold a high static charge, the integrated circuit may be ruined upon such contact with the connection pins, and the fact will not be ascertainable until final inspection of the assembled conductor board, with a resulting high rate of rejects.

These problems are currently dealt with by equipping the assembly table with a rotatable magazine in which the integrated circuits are contained in ordered sequence. Thus the operator using the integrated circuit assembly tongs can pick the desired integrated circuit directly out of the magazine. A disadvantage, however, is that the rotatable magazine, which may hold numerous different integrated circuits, must be arranged on the assembly table so that the operator must reach across with the assembly tongs and carry back each integrated circuit a considerable distance. This is an exacting task and requires very close attention on the operator's part. With such an arrangement, furthermore, automatic assembly is not possible.

SUMMARY OF THE INVENTION

An object of the invention, then, is to devise an assembly table such as to permit safe direct picking up of integrated circuits with assembly tongs within a short reach.

The present invention overcomes the above-described disadvantages of the prior art and provides a table that permits safe direct picking up of the integrated circuits with the assembly tongs within a short reach in that a transfer means takes one integrated circuit at a time from the rotatable magazine and inserts it in a tray having a recess adapted to accept the integrated circuit in question in preassigned position.

According to the invention, a particular integrated circuit is taken in the manner described above from the rotatable magazine by the transfer means and is inserted in a tray so that the operator, after the tray has been conveyed to the assembly station, can pick up one integrated circuit with the integrated circuit assembly tongs within a short reach and then insert it in the preassigned location on the conductor board to be assembled, with no great difficulty. If desired, this insertion may even be accomplished automatically, due to the arrangement of the integrated circuit in the tray in a preassigned position.

The present invention, in another aspect, makes it possible to supply a large number of components, among which there may be a variety of integrated circuits, to the assembly station in preassigned sequence and in preassigned position, so that the insertion operation may be performed within a very short reach. Moreover, the recess in the tray, or in a tray insert, may be adapted so as to provide a positive guidance for the integrated circuit assembly tongs, in order to facilitate substantially the picking up of the integrated circuits from the tray and to avoid any damage due to static charge. At the same time, the rotatable magazine and the tray may be so adapted to each other and so controlled as to ensure that only certain particular integrated circuits may be taken from the rotatable magazine and supplied to the assembly station. Such control may for example be achieved by synchronization, or else by coding the respective trays and the pockets corresponding to the integrated circuits to be placed therein in the preferably rotatable magazine. Such arrangement is particularly advantageous when various different integrated circuits are to be inserted in the conductor board and when the insertion of integrated circuits is alternated with that of other components. Power to the several parts of the transfer means may be supplied by pneumatic cylinders.

According to a preferred embodiment, discussed herein by way of example, the rotatable magazine is in the form of a carrousel, having a plurality of lateral vertical tracks to accept the integrated circuits. The transfer means is arranged so as to be radially displaceable relative to the carrousel and contains a pick-up member, preferably in the form of a pair of tongs. The tongs have an opening range at least sufficient to pick up the widest available integrated circuits. Initially, the tongs take an integrated circuit out of the tracks in radial horizontal direction and then move away from the carrousel. The tongs then dip about a horizontal axis so that the integrated circuit is arranged with connection pins pointing downward. Then the tongs with the integrated circuit carried thereby are lowered so that the integrated circuit is inserted or placed in the recess, preferably with holes matching the connection pins, of the insert of the tray in question. Then the tongs are retracted again and turned back to their initial position, whereupon a fresh transfer operation can be initiated.

BRIEF DESCRIPTION OF THE DRAWINGS

The invention will be illustrated in more detail with reference to the embodiment represented by way of example in the drawings, wherein:

FIG. 2 is a side view in partial section of a transfer means according to the invention with an associated magazine and an associated tray;

FIG. 3 is a top view of the arrangement of FIG. 2;

FIG. 4 is a section taken along line IV—IV of FIG. 2;

DETAILED DESCRIPTION OF THE PREFERRED EMBODIMENT

Figure 1:
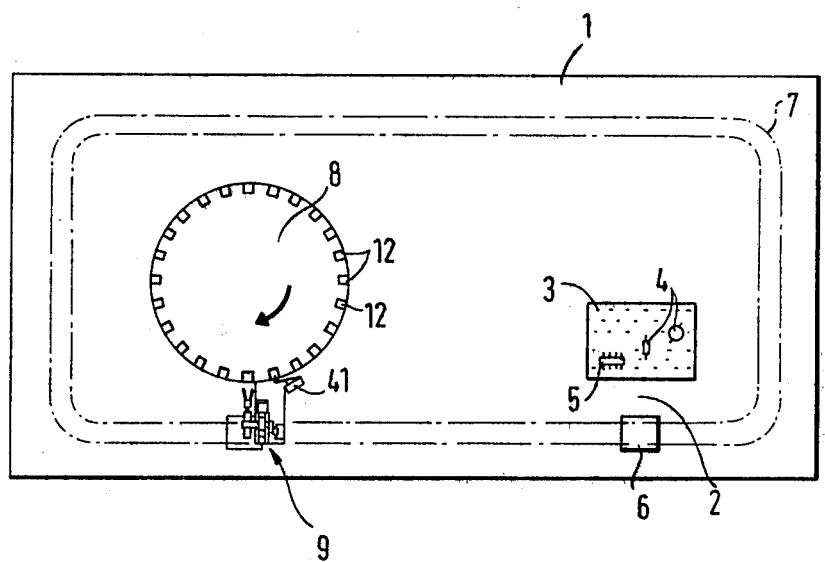
FIG. 1 is a schematic top view of an assembly table constructed according to the invention.

FIG. 1 shows a top view of an assembly table 1 having an assembly station 2 in its lower right-hand corner as viewed in FIG. 1. A conductor board 3 to be assembled is mounted at the station 2. In this conductor board 3, discrete components 4, such as resistors, transistors, capacitors, etc. may be inserted, along with some integrated circuits 5 to be inserted as well.

For the assembling operation, components 4, 5 are taken from trays 6 after they have been conveyed to station 2. Such trays, each accepting only one type of component 4, 5, are circulated along the table 1 by conveyor means 7. In other words, at least as many trays 6 must be provided as there are different components 4, 5 to be inserted in the conductor board 3.

For inserting integrated circuits 5 in the conductor board 3, it has been found disadvantageous for the tray to contain several like integrated circuits, because their connection pins and tabs may tangle, in which case the operator would be obliged to separate manually the selected integrated circuit 5 from the other integrated circuits. In addition, disadvantages would result because special integrated circuit assembly tongs must be used to insert the integrated circuits 5 in the board 3.

As mentioned above, touching the integrated circuits with the hand may ruin them because of static charge carried by the operator. Attempts have been made to avoid this damage by having integrated circuits taken, not from a tray 6, but from a rotatable magazine 8 in which the respective integrated circuits are contained in preassigned position. Under this arrangement, the operator reaches to the rotatable magazine 8 with the assembly tongs, picks up the integrated circuit 5, and then places it in the conductor board 3. This, however, requires an unduly long reach and jeopardizes the accuracy of pick-up of the integrated circuit 5 from the rotatable magazine 8. Moreover, since the other discrete components 4 continue to be picked up from the trays 6 as supplied, this method leads to two completely different assembly procedures, with the resulting possibility of errors particularly where assembly is to be done manually.

According to the invention, an integrated circuit 5 to be inserted in the conductor board 3 to be outfitted is not taken directly from the rotatable magazine as before, but instead it is placed into and then taken from the tray 6. In further contrast to the prior art, the integrated circuit is already in preassigned position. To achieve this arrangement, the assembly table 1 is provided with a transfer means 9 which operates automatically to pick up an integrated circuit 5 from the rotatable magazine 8, and to insert the integrated circuit 5 in a recess provided in the tray 6. It is preferable that the recess in the tray 6 be formed to match the integrated circuit to be inserted.

The transfer means 9, which is represented schematically in FIG. 1, will be more fully explained with reference to the embodiment represented by way of example of FIGS. 2 to 6.

As shown in FIGS. 2-4, the table 1 has a conveyor means 7 for tray 6 such that, in order to protect the tray 6 and the components therein, access to the tray 6 can be had only through an opening 11 in the top of table 1. The rotatable magazine 8 is arranged over the table 1, with vertical tracks 12 provided along the periphery of the magazine, each storing integrated circuits, 5″ of a given type and preferably in a given orientation. (In FIGS. 2-6 the integrated circuit is indicated as 5″ in its position in the magazine 8, as 5′ in its position is the transfer means 9 and as 5 in its position in the tray 6.)

Figure 5:
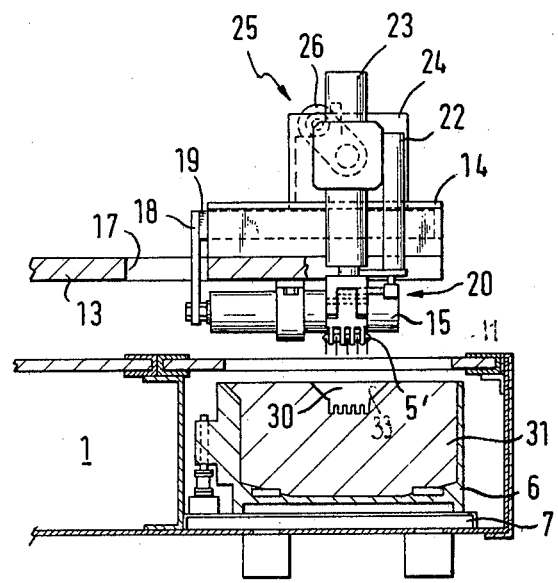
FIG. 5 is a fragmentary view showing the transfer means of FIG. 2 as swung about a horizontal axis.
Figure 6:
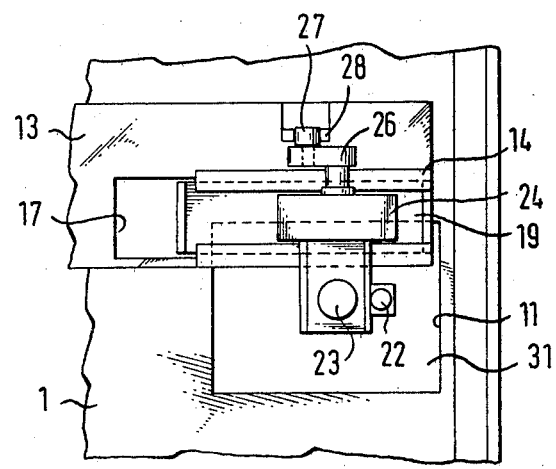
FIG. 6 is a top view of the transfer means of FIG. 5.

Parallel to the table 1 in this example, a bracket 13 is provided with guide passages 14 over the opening 11 in the table 1 radial to the rotatable magazine 8. Under the bracket 13, a pneumatic pusher 15 is attached, whose piston rod 16 is connected by a plate 18 extending through a slot 17 in the bracket to a carriage 19. The carriage 19 is guided in the passages 14 and is horizontally movable therealong by actuation of the cylinder 15. To take the integrated circuit 5″ out of the track 12 and insert it in the tray 6, the transfer means has a gripping means 20 connected to the carriage. The gripping means 20 comprises pick-up tongs 21, with jaws designed to pick up an integrated circuit 5′. The tongs are opened and closed by means of a pneumatic cylinder 22 whose piston rod acts on the jaws of the tongs 21. The tongs 21 themselves are also attached to the piston rod of another cylinder 23. The carriage 19 is fitted with a swivel 24 in or on which the gripping means 20 is rotatably mounted. Rotation or swinging of the gripping means 20 about a horizontal axis perpendicular to the direction of displacement of the carriage 19 is obtainable with a swinging means 25 (FIG. 4). This swinging means 25 may, for example, comprise a rotary drive such as a motor or the like. In the embodiment shown by way of example, the swinging means 25 accomplishes a swinging of the gripping means 20 out of its horizontal position, opposite the rotatable magazine 8, through 90° into a vertical position opposite the tray 6 (FIGS. 5-6). In this embodiment, the swinging means 25 consists of a cam lever 26 with cam 27 carried against a stop 28 attached to the bracket at one of the guide passages 14, this swinging being triggered by the collision of the cam 27 with the stop 28. Alternatively, of course, some other angle of swing may be obtained by suitable design of the lever 26 and stop 28 if desirable.

The position of the gripping means 20 which swung through 90° is represented in FIG. 5. In this position, the gripping means 20 is opposite a recess 30 in the tray 6, the recess 30 being formed in an insert 31 which is inserted in tray 6 (FIG. 2). By use of such an insert, the tray 6 fixed to the conveyor means 7 may remain in place. Moreover, in the case of a change in integrated circuits to be inserted, only the insert 31 need be replaced with an insert having a different recess matching the new integrated circuit configuration. The recess 30 preferably has matching holes 32 for the connection elements, i.e. pins or tabs, of the integrated circuit 5 matching the recess 30. In this way the integrated circuits 5 an inserted in consistently reproduced position in the recess 30. Thus, when the pick-up tongs 21 holding the integrated circuit 5' are released by cylinder 22 after they have been swung by 90° to the vertical position shown in FIG. 5, the integrated circuit 5' will be deposited in the recess 30. The pick-up tongs 21 are first moved, along with the gripping means 20, towards the recess 30, preferably by means of the cylinder 23.

After the integrated circuit 5' has been deposited in the recess 30, the gripping means is swung back into the horizontal position (FIG. 2) and the tray 6 is moved along by the conveyor means 7.

According to a further refinement, the recess 30 also is equipped with a positive guide, in the form of an incline 33 (FIG. 2). Such incline ensures that the integrated circuit assembly tongs will positively engage the integrated circuit 5 in the recess 30 at the assembly station 2. It also ensures that the integrated circuit 5, 5' will be correctly and positively inserted by the gripping means 20.

Often integrated circuits of various types must be inserted in the conductor board 3. For this purpose, it is necessary that the rotatable magazine 8 be equipped with tracks 12, so that the track 12 corresponding to the type of integrated circuit 5" to be inserted in the tray 6 may be arranged opposite the transfer means. This arrangement may be advantageously arrived at with the aid of a positioning mechanism. As shown in the embodiment depicted in FIG. 3, the positioning mechanism may consist of a rest 40 in preassigned position on the rotatable magazine 8 and a switching means, for example a microswitch 41, on the transfer means 9 to cooperate with the rest 40. The microswitch is suitably connected to control operation of the transfer means 9, so that only when the switching means detects, by engaging the rest 40, that the currently required track 12 of the gripping means is opposite transfer means 9 will the operation of transfer means 9 be initiated. In addition, it is preferable to provide a release means to cooperate with tray 6. Such release means may be embodied in a switching means 42 cooperating with the tray 6, by way of a cam 43. It is also possible to adopt an arrangement whereby the positioning mechanism 40, 41 and the release means 42, 43 may function together.

Preferably the release means 42, 43 is designed to permit a coding in order to detect whether the recess 30 of the tray 6 matches the integrated circuit 5" to be picked up from the track 12. Such coding may be mechanical, with a multiple cam control. or it may be electronic. Preferably the positioning mechanism 40, 41 is constructed and arranged to cooperate in similar manner with the release means 42, 43. The latter may be program-controlled, whereby the station 2 can always be supplied with the integrated circuit 5 from time to time as required, in proper sequence.

As a still further refinement, the gripping means 20 may be provided with means to rotate the gripping means through a predetermined angle before the integrated circuit is inserted in the recess 30 in the plane of the table 1 in order that the integrated circuit assembly tongs will not have to be rotated further to insert the integrated circuit in the conductor board. Preferably the gripping means 20 has a detection member to ascertain how the integrated circuit 5" is oriented in the track 12. For example, the U-shaped opening in one long side of the integrated circuit can be detected to ascertain the orientation. Depending on the location of this opening, a rotation through 180° may then be executed, with the result that it will not be necessary to load the integrated circuit in the track in a preassigned orientation. These refinements are especially desirable when a fully automatic assembling of the conductor board is required.

The idea of the invention may also be applied in a manner such that discrete components may be supplied to the assembly station 2 in preassigned position, as would be particularly desirable when an automatic outfitting is called for.

From the foregoing it will be appreciated that with the transfer means described herein an assembly table may be provided that permits safe, direct picking up of integrated circuits with assembly tongs within a short reach.

I claim:

1. An assembly table for assembling conductor boards, said table comprising means forming an assembly station, a magazine in which integrated circuits are contained in a predetermined arrangement so that they may be picked up in preassigned position with integrated circuit assembly tongs and inserted into conductor boards at the assembly station, a plurality of trays having recesses formed in them to receive said integrated circuits, means for conveying said trays from said magazine to said assembly station and transfer means positioned at said magazine and movable in one direction to pick up an integrated circuit from said magazine and in another direction to place said integrated circuit into a recess in one of said trays.

2. An assembly table according to claim 1, wherein the transfer means includes a pick-up member with a releasable gripping means to grip an integrated circuit in the magazine and to release the integrated circuit when it is inserted into said recess of one of said trays and swinging means arranged to swing the pick-up member between a pick-up orientation, in which an integrated circuit is picked up from the magazine, and an insertion orientation, in which the integrated circuit is inserted in the recess.

3. An assembly table according to claim 2, wherein the releasable gripping means comprises pick-up tongs with jaws arranged to be brought together and apart by actuating means to grip and release said integrated circuit.

4. An assembly table according to claim 2 wherein said transfer means is operative to pull a gripped integrated circuit out from the magazine in a straight line prior to operation of said swinging means.

5. An assembly table according to claim 4, wherein said transfer means is operative to insert a gripped integrated circuit into a recess in a straight line after operation of said swinging means.

6. An assembly table according to claim 4 wherein said transfer means includes means constructed to insert a gripped integrated circuit into a recess in a straight line after operation of said swinging means.

7. An assembly table according to claim 6, wherein said transfer means includes a member moveable in one direction to pull a gripped integrated circuit from the magazine and in the opposite direction to insert said gripped integrated circuit into a recess.

8. An assembly table according to claim 2 wherein guide means are arranged to guide the transfer means parallel to the table.

9. An assembly table according to claim 8 wherein said guide means comprises ways mounted on the table and a carriage guided in said ways and mounting said swinging means.

10. An assembly table according to claim 8 wherein a cam lever having a cam is mounted on said swinging means and wherein a stop is mounted on said table in the path of said cam when said transfer means moves along said guide means whereby engagement of said stop by said cam during said movement actuates said swinging means.

11. An assembly table according to claim 6 wherein at least one pneumatic cylinder is positioned and connected to produce said straight-line movements.

12. An assembly table according to claim 2 wherein a pneumatic cylinder is positioned and connected to actuate the gripping means.

13. An assembly table according to claim 1 wherein a bracket is mounted to extend parallel to said one direction, said transfer means being mounted on said bracket.

14. An assembly table according to claim 1 wherein said recesses are formed in inserts provided in said trays.

15. An assembly table according to claim 14 wherein said recesses are shaped to provide guidance to integrated circuit assembly tongs used to remove said integrated circuits from the recesses in said trays.

16. An assembly table according to claim 14 wherein said recesses are formed with holes for the connection elements of integrated circuits from said magazines.

17. An assembly table according to claim 1 wherein said magazine includes plural vertical tracks each arranged to accept a specific type of integrated circuit.

18. An assembly table according to claim 17 wherein said magazine is rotatable and is arranged in conjunction with said transfer means to align selected tracks with said transfer means for pick-up of said integrated circuits by said transfer means.

19. An assembly table according to claim 18, including alignment means responsive to the movements of said magazine to align said selected tracks with the transfer means.

20. An assembly table according to claim 19 wherein said alignment means includes rests in preassigned locations on the magazine and switching means mounted to cooperate with said rests to initiate operation of said transfer means in response to engagement between a rest and said switching means.

21. An assembly table according to claim 1 wherein triggering means are arranged to initiate operation of the transfer means when a recess is said magazine containing integrated circuits comes to a preassigned position relative to the transfer means.

22. An assembly table according to claim 21 wherein said triggering means is provided with further switching means arranged to cooperate with the positioning of said trays.

23. An assembly table according to claim 19 wherein said triggering means and said further triggering means are arranged to cooperate to initiate operation of said transfer means.

24. An assembly table according to claim 23 wherein the first triggering means is coded to position a preassigned track of the magazine in relation to the transfer means.

25. An assembly table according to claim 1 wherein said transfer means is provided with means for controlling the operation thereof such that integrated circuits are picked-up from the magazine and are inserted into the recesses of said trays in a predetermined sequence.

26. An assembly table according to claim 2 wherein rotating means an provided to swing the pick-up member after it picks up an integrated circuit magazine and before said pick-up member inserts said integrated circuit into a recess whereby the integrated circuit becomes aligned with the recess.

27. An assembly table according to claim 26 wherein a detection member is arranged to detect the orientation of the longitudinal axis of the integrated circuit in the magazine and rotary control means are provided to initiate operation of the rotating means, to rotate the integrated circuit through an angle of as much as 180° about its longitudinal axis.

28. An assembly table according to claim 26 wherein the recess in each tray is oriented such that the position of the integrated circuit therein corresponds with the orientation of the integrated circuit as finally mounted on the conductor board.

* * * * *